United States Patent [19]
Thompson, III et al.

[11] Patent Number: 5,521,983
[45] Date of Patent: May 28, 1996

[54] SPEAKER SYSTEM FOR USE IN HIGH BACKGROUND NOISE ENVIRONMENTS

[75] Inventors: George W. Thompson, III, Harwichport; Glenn R. Greenough, Dennis; Donald M. Thompson, Harwichport, all of Mass.

[73] Assignee: Vectra Corporation, Harwich, Mass.

[21] Appl. No.: 144,668

[22] Filed: Oct. 28, 1993

[51] Int. Cl.[6] .................................................. H03G 5/00
[52] U.S. Cl. .................................................. 381/98; 381/94
[58] Field of Search .................................. 381/94, 98, 101

[56] References Cited

U.S. PATENT DOCUMENTS

| | | |
|---|---|---|
| 4,025,721 | 5/1977 | Graupe et al. ................ 381/94 |
| 4,135,590 | 1/1979 | Gaulder ......................... 381/94 |
| 4,185,168 | 1/1980 | Graupe et al. ................ 381/94 |
| 4,790,018 | 12/1988 | Preves et al. ................ 381/101 |
| 5,067,157 | 11/1991 | Ishida et al. ................. 381/94 |

*Primary Examiner*—Stephen Brinich
*Attorney, Agent, or Firm*—Samuels, Gauthier & Stevens

[57] ABSTRACT

A speaker system for use in a high background noise environments is disclosed. The system receives an input electrical signal and produces an output sound signal predominantly within a predetermined frequency range different than the frequency range of the background noise. The system includes a bandpass filter for frequency filtering the input signal, and an audio transducer for receiving the filtered signal and producing the output sound signal. The audio transducer produces output sound signals predominantly within the predetermined frequency range.

7 Claims, 3 Drawing Sheets

SPEAKER SYSTEM FOR USE IN HIGH BACKGROUND NOISE ENVIRONMENTS

BACKGROUND OF THE INVENTION

The invention relates to a speaker system for use in noisy environments and specifically relates to a speaker system capable of providing a clear sound signal at a reasonable volume level in a high background noise environment.

Speaker systems in high background noise environments must overcome the background sounds if the speaker output is to be heard and understood by individuals in the environment. For example, in the marine environment on board a commercial fishing vessel, a speaker system must compete with engine noises and other power equipment noises, as well as water and wind noises in adverse weather conditions. A speaker system in such an environment may be employed to provide a speaker output for a radio or navigational equipment. Other environments in which a speaker system must overcome background noises include refineries, printing presses, sawmills, aircraft cabins, airports and any other noisy workplace in which power equipment and machinery is operating.

Present speaker systems for use in high background noise environments typically overcome the background noise by increasing the amplitude (volume level) of the output signal. Although this method may permit the signal to be heard over the background noise, it also has several drawbacks. First, the components of the speaker system must be capable of handling the high electrical currents and increased stresses associated with producing a high volume output without significant distortion. Second, if the background noise fluctuates in volume, the speaker output must correspondingly be adjusted in volume so as to not provide discomfort to the listener. And third, the speaker output itself contributes to the already high noise level in the environment.

Other methods of overcoming high background noise include the use of a plurality of speakers. Unfortunately, in multi-speaker systems there is often a time delay between one or more output sound signals and this delay can detract from the overall sound quality of the system.

Additional problems with present speaker systems include the fact that most public address speakers provide unidirectional outputs that require a listener to be in a specific area in order to best hear the speaker output signal. Also, most conventional speaker systems are overly loud in close proximity to the speaker to enable the sound to be audible a significant distance from the speaker.

There is a need, therefore, for a speaker system that can be used in a high background noise environment at a reasonable volume and provide an output signal that is easily understandable.

SUMMARY OF THE INVENTION

The high background noises in certain environments are often concentrated within a definable frequency range. For example, in the marine environment, background noises from the engine, power equipment, the water and the wind are predominantly low frequency sounds. Background noises generated by power equipment in woodworking and machine shops are often high frequency sounds.

Applicants have discovered that a speaker system tailored to produce output signals within a relatively narrow frequency range is capable of penetrating high background noise with remarkable success. Specifically, if the narrow frequency range of the output signal is selected to be significantly different than the frequency range of the background noises, then the output signal is easily discernable at a reasonable volume in areas where the background sounds compete or conflict with the output signals. The speaker systems include a band pass filter and audio transducer components that are designed to produce output signals within the predetermined frequency range.

DETAILED DESCRIPTION OF THE PREFERRED EMBODIMENTS

The broad range of frequencies of sound audible to humans is approximately 20. Hz to 20,000. Hz. Although general purpose speaker systems (such as high fidelity speakers) have typically sought to produce high quality sound over much of this broad range, applicant's invention is directed to speaker systems that produce sound signals within a predetermined narrower frequency range. The narrower range sound signal is better suited for penetrating high background noises and is more easily heard and understood by listeners in a high background noise environment when the sound signal frequency is significantly different than that of the background noise.

For example, speaker systems of the invention may be used in marine environments having low frequency background noises, where the predetermined output frequency range is selected to be within a higher frequency range. It has been found that in such a marine environment, the background noises are predominantly below 900 Hz. Accordingly, the speaker system of the invention for use in the marine environment is designed to produce output sound signals predominantly within the frequency range of 800 Hz. to 1400 Hz.

In environments where the background noise is predominantly of a high frequency, the predetermined frequency range is selected to be within the low frequency range. A speaker system for the marine environment includes bandpass filter electronics and audio transducer components as described below.

Figure 1:
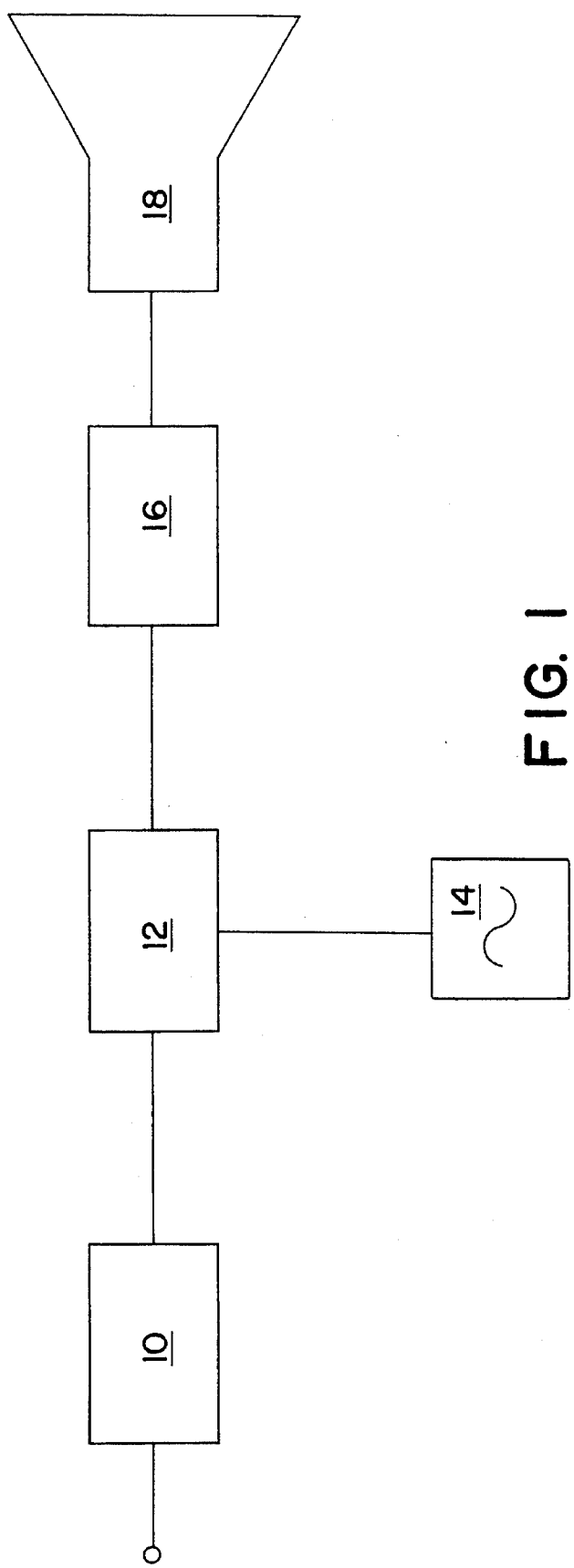
FIG. 1 shows a block diagram of the components of a system of the invention.

As shown in FIG. 1, the electronic components of the system include a line receiver 10, a bandpass filter 12, a clock oscillator 14, a power amplifier 16, and an audio transducer 18. The line receiver 10 receives an input signal from an audio source and is designed to reject extraneous noise which may result from electrical interference from components such as cables. The line receiver 10 includes a SSM2143 semiconductor element, and the electronic components are powered by a 12 volt power supply.

The bandpass filter 12 reduces the bandwidth of the signal to the 800 Hz. to 1400 Hz. frequency range. In the present embodiment, the system is further enhanced in that the predetermined frequency range includes the optimum frequencies for human intelligibility (about 1200 Hz.). Filtering the electronic speech signal also improves the efficiency of the audio transducer components. The bandpass filter includes a TP3040J semiconductor element.

The Oscillator 14 (which operates at 2 MHz.) provides a frequency reference for the bandpass filter 12. The power amplifier 16 boosts the signal to a power level sufficient to drive the audio transducer components. The power amplifier 16 includes a TDA7241 semiconductor element. A differential output stage is also employed to provide sufficient power in the event that the supply power voltage is limited.

The audio transducer 18 converts the electrical signal into sound, and includes specially selected driver components as well as a specifically shaped folded horn sound reflector assembly. The driver components are selected to produce sound signals predominantly within the predetermined frequency range only; this further contributes to bandpass filter the signal. The design of this audio transducer is in contrast to conventional general purpose speakers that are designed to produce sounds of a wide range of frequencies, all with similar clarity. The folded horn assembly is designed to produce omni-directional sound.

Figure 2:
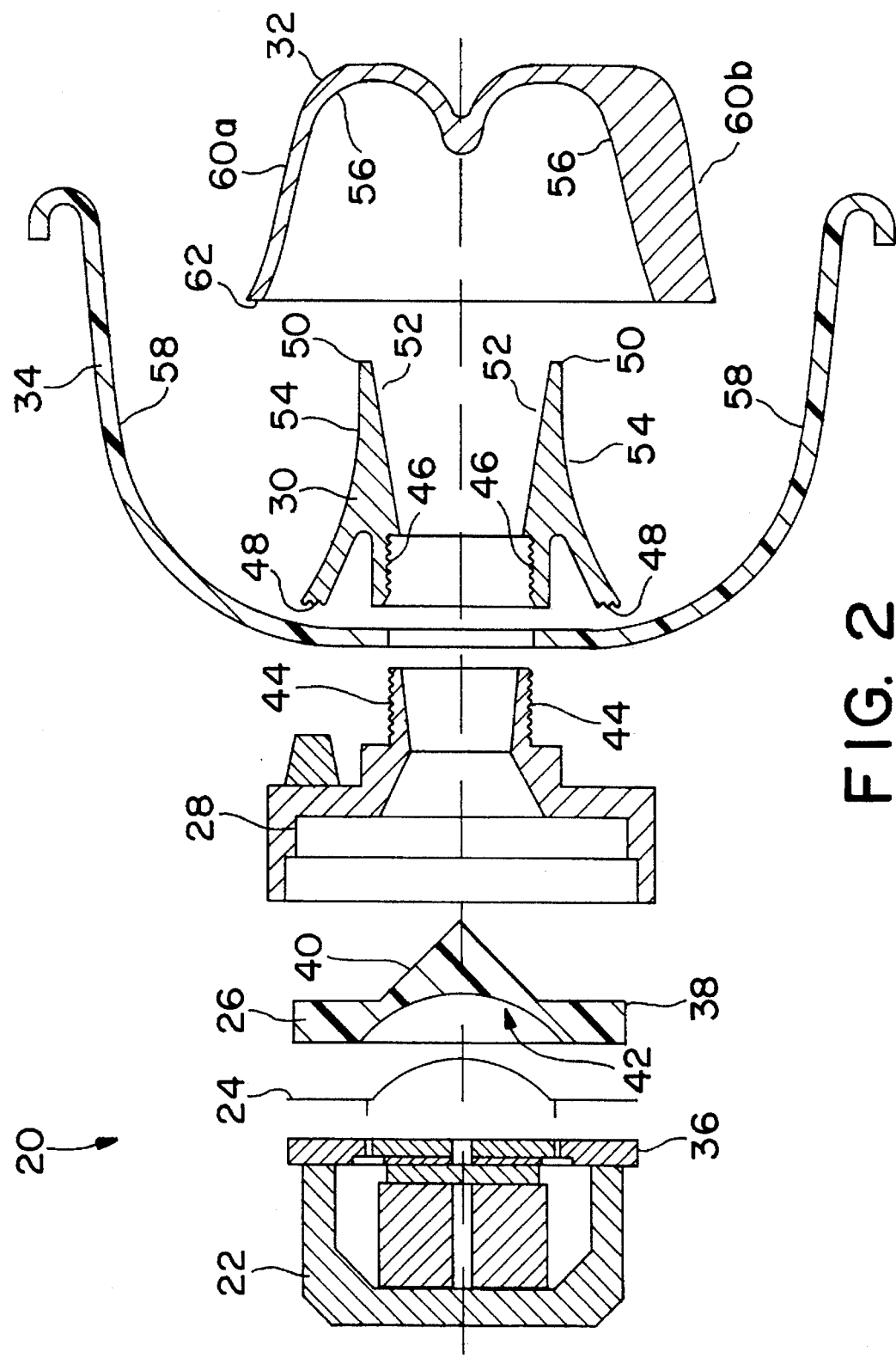
FIG. 2 shows an exploded diagram in cross-section of the components of an audio transducer of the invention.

As shown in FIG. 2, the driver components of the audio transducer 20 in the present embodiment include a magnet assembly 22, a speaker coil 24, a driver phasing plug 26, a driver base 28, a speaker tube 30, a speaker bell 32, and a speaker horn 34. The system has a maximum power output of about 30 Watts, and produces a maximum sound at a pressure level of 115 dB.

With the exception of the magnet and the voice coil, all of the components may be constructed of plastic materials of a controlled density. These materials are preferred since they do not include harmonic resonances (or secondary sound generating characteristics of their own) that would adversely affect the narrow frequency sound signals produced by the transducer. This further eliminates aliasing, ringing and unwanted sound distortion.

The magnet assembly 22 is constructed of ALNICO and the outer face 36 of the magnet assembly 22 measures about 2.12" in diameter and about 0.17" in thickness. The voice coil wire 24 is preferably beryllium copper wire. The driver phasing plug 26 is constructed of high-density, acoustically dead or non-resonant plastic and measures 1.985" in diameter. The base 38 of the plug 26 is 0.25" thick and the triangular protrusion 40 extends 0.475" from the base 38. The inner surface 42 of the plug 26 includes a spherical shape having a 0.86" radius. The driver base 28 is also constructed of the above-described plastic and measures 2.85" in diameter and 1.425" to the tip of the threaded portion 44.

Figure 3:
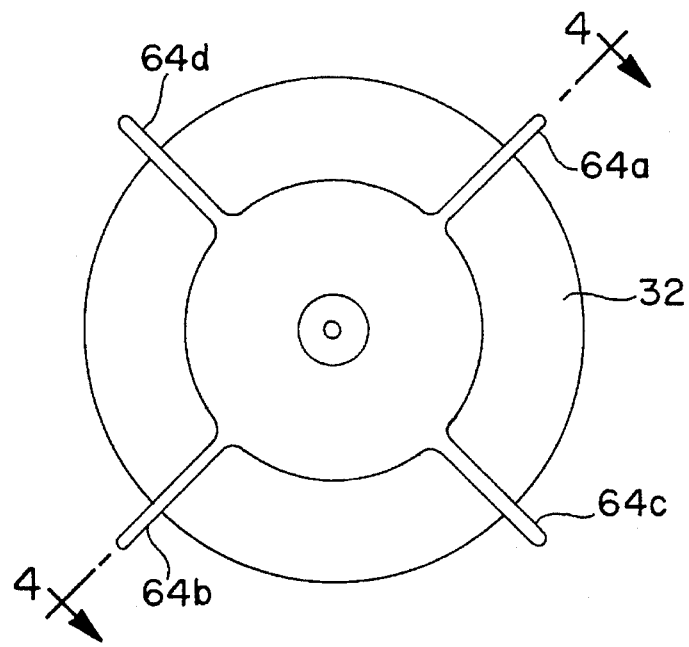
FIG. 3 shows a front view of a speaker bell of the invention.
Figure 4:
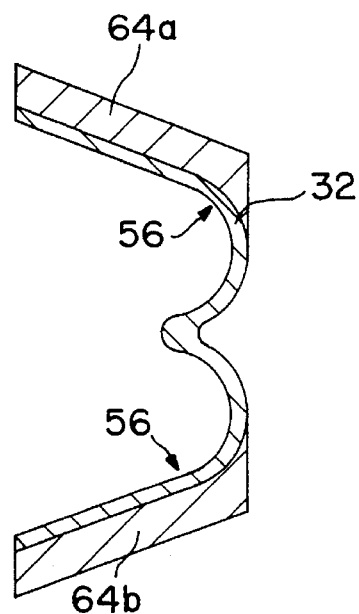
FIG. 4 shows a cross-sectional view of the speaker bell shown in FIG. 3 along line 4—4.

The threaded portion 44 of the driver base 28 connects with the threaded portion 46 of the speaker tube 30. The speaker tube 30 measures 1.9375" in diameter on the back side 48, and 1.1875" in diameter on the front side 50. The speaker tube 30 is designed to project the sound signal into the speaker bell 32 along its inner surface 52, and is also designed to reflect the sound signal into the speaker horn 34 from its outer surface 54. Similarly, the inner surface 56 of the speaker bell 32 is designed to project the sound signal into the inner surface 58 of the speaker horn 34 (and/or the surface 54), and is also designed to reflect the sound signal from its outer surface 60 into the surrounding environment. The outer surface 60 of the speaker bell 32 includes four fins 64 as shown in FIGS. 3 and 4. This provides additional omni-directional output capabilities by scattering the output sound signal in an asymmetrical pattern.

Each of the tube 30, bell 32 and horn 34 components are made of acoustically non-resonant plastic. The driver phasing plug 26 includes through holes to connect the audio input lines from an amplifier to the voice coil. The speaker tube 30 attaches to the speaker bell 32 via mounting posts extending between the two components in accordance with conventional mounting techniques.

The predetermined frequency range for the present embodiment is 800 Hz. to 1400 Hz. Since the speed of sound (in air at 0° C.) is 13,044 inches per second, the wavelengths of this predetermined range are therefore between 13044/800 to 13044/1400, or 16.305" to 10.87". The relative positioning and shapes of the surfaces 52, 54, 56, 58 and 60 are all designed to optimally reflect sound signals that are within the predetermined frequency range. The shapes and relative sizes of the components depicted in FIG. 2 are illustrated to scale with respect to one another.

Specifically, the inner surface 52 of the tube 30 is linearly shaped, extends about 1.065" in length, and is positioned to extend radially inward at an angle of about 1.23° from horizontal. The outer surface 54 of the tube 30 is curved and its shape may be approximated by diameter measurements taken from the front end 50 to the back end 48 every 0.25" (the last interval being 0.224") as follows: 1.203", 1.250", 1.328", 1.469" and 1.688". The front end 50 of the tube 32 is mounted about 0.245" from the inner surface 56 of the bell 32.

The inner surface 56 of the bell 32 is also curved and may be approximated by measurements taken at 0.25" intervals beginning at the outer edge 62 of the bell 32 as follows: 2.375", 2.175", 2.025", 1.925", and 1.800". The inner surface 56 of the bell 32 is symmetrical. The outer surface 60 of the bell 32 follows the inner surface 56 with a wall thickness of 0.090" As shown in FIGS. 3 and 4, the fins 64a–64d are symmetrical and radially height from about 0.338" and 0.500". The fins 64 are also about 0.090" thick.

The speaker horn 34 is a folded horn shell having a curved wall and a rounded rim. The distances through which the output sound must travel are designed to optimally reflect sound signals within the predetermined frequency range.

The speaker system of the above embodiment is capable of penetrating loud, low frequency background sounds and delivering a clear intelligible sound signal to a person in the environment at reasonable volume. It will be understood by those skilled in the art that numerous modifications may be made to the above disclosed embodiment without departing from the spirit and scope of the invention.

We claim:

1. A speaker system for use in a high background noise environment, said system for receiving an input electrical signal and for producing an output sound signal predominantly within a predetermined frequency range different than the frequency range of said background noise, said system comprising:

bandpass filter means for frequency filtering said input electrical signal to produce a filtered signal predominantly within said predetermined frequency range; and audio transducer means for receiving said filtered signal and for producing said output sound signal into said high background noise environment, wherein said audio transducer means produces said output sound signal predominantly within said predetermined frequency range.

2. A speaker system as claimed in claim 1, wherein said audio transducer means further includes folded horn sound reflector components designed to reflect said output sound signal within said predetermined frequency range.

3. A speaker system as claimed in claim 1, wherein said background environment sounds are predominantly low frequency sounds and wherein said predetermined frequency range is within the high frequency range.

4. A speaker system as claimed in claim 1, wherein said predetermined frequency range is between about 800 Hz and 1400 Hz.

5. A speaker system as claimed in claim 1, wherein said audio transducer includes sound waveguide and reflector components made of acoustically non-resonent material.

6. A speaker system for use in a marine environment having substantial background sounds of a predominently low frequency, said system for receiving an input electrical signal representative of acoustic sounds and for producing an output sound signal predominantly within a predetermined frequency range higher than the frequency range of said background sounds, said system comprising:

bandpass filter means for frequency filtering said input signal to produce a filtered signal predominantly within said predetermined frequency range; and audio transducer means for receiving said filtered signal and for producing said output sound signal in said high background noise environment, wherein said audio transducer means produces said output sound signal predominantly within said predetermined frequency range.

7. A speaker system for use in a marine environment including substantial background sounds within a first frequency range, said speaker system comprising:

input means for receiving a set of input electrical signals representative of a set of sound signals within an second frequency range, said second frequency range at least partially overlapping said first frequency range;

filter means for removing from said set of input electrical signals a portion of said set of input signals representative of sound signals having frequencies within both said first and second frequency ranges, and for producing a filtered set of output electrical signals; and audio transducer means including folded horn and bell sound reflector components for receiving said set of output electrical signals and for producing output sound signals responsive to said output electrical signals, said output sound signals having frequencies between about 800 Hz and 1400 Hz and said sound reflector components being sized and shaped to maximally reflect sound signals predominently between 800 Hz and 1400 Hz.

* * * * *